United States Patent [19]

Kwak

[11] Patent Number: 5,898,731
[45] Date of Patent: Apr. 27, 1999

[54] AUTO-COEFFICIENT RENEWAL DIGITAL CHANNEL EQUALIZER

[75] Inventor: Heung Sik Kwak, Kyungki-do, Rep. of Korea

[73] Assignee: LG Electronics Inc., Seoul, Rep. of Korea

[21] Appl. No.: 08/792,804

[22] Filed: Feb. 3, 1997

[30] Foreign Application Priority Data

Feb. 3, 1996 [KR] Rep. of Korea .......................... 96-2625
Feb. 3, 1996 [KR] Rep. of Korea .......................... 96-2626

[51] Int. Cl.[6] ....................................................... H03H 7/30
[52] U.S. Cl. .......................... 375/230; 375/232; 375/350; 364/724.2; 333/18; 333/28 R
[58] Field of Search .................................... 375/230, 232, 375/350, 14, 94, 99, 101; 364/724.2; 333/18, 28 R; 370/43

[56] References Cited

U.S. PATENT DOCUMENTS 5,359,628  10/1994  Muto ........................................ 375/232
5,475,710  12/1995  Ishizu et al. ............................. 375/232
5,654,765   8/1997  Kim ......................................... 375/232

*Primary Examiner*—Stephen Chin
*Assistant Examiner*—Tuan Le

[57] ABSTRACT

An auto-coefficient renewal digital channel equalizer is disclosed, including an auto-coefficient renewing device for automatically renewing a coefficient using received data and an error signal, an error detecting device for detecting an error signal from a signal of the auto-coefficient renewing device, a device for determining convergence or divergence of the error signal detected in the error detecting device to produce a convergence or divergence signal according to a result of the determination, and an error processing device for shifting down the error signal detected in the error detecting device a certain number of bits in response to a convergence signal to produce a signal smaller than the received error signal to the auto-coefficient renewing device, thereby processing the coefficient renewal at the same rate with the data for all of the taps of an equalizer. The equalizer converges at an increased rate, and operation of the equalizer is made more stable even in diversion of a reception channel.

23 Claims, 11 Drawing Sheets

F I G.7
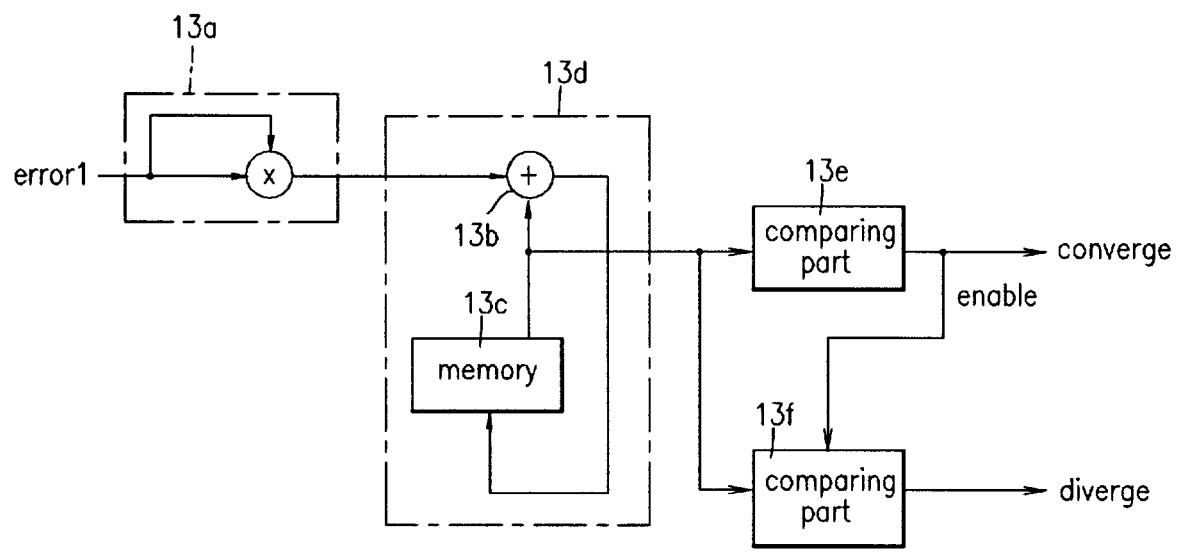
F I G.8
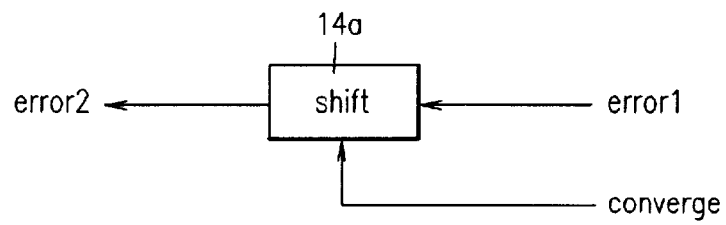

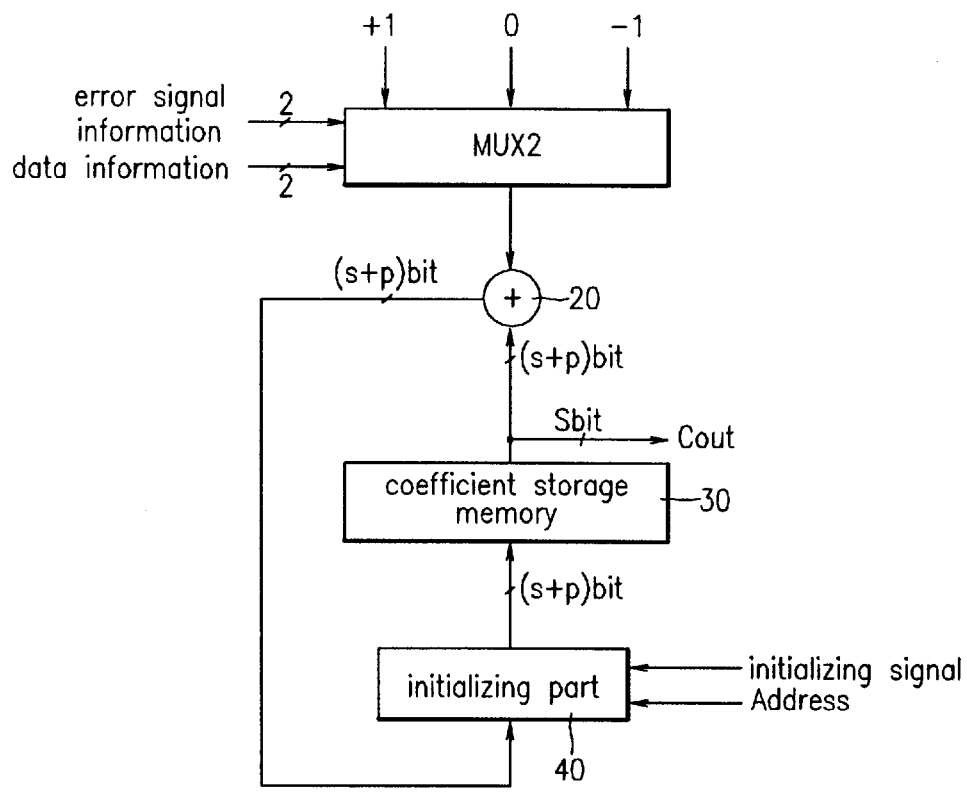
F I G.11
F I G.12
|  |  | error | |
|---|---|---|---|
|  |  | smaller than a predetermined size | greater than a predetermined size |
| data | smaller than a predetermined size | $C^{j+1} = C^j$ | $C^{j+1} = C^j$ |
|  | greater than a predetermined size | $C^{j+1} = C^j$ | identical polarity $C^{j+1} = C^j + 1$ different polarity $C^{j+1} = C^j - 1$ |

F I G.13a
F I G.13b
F I G.13c
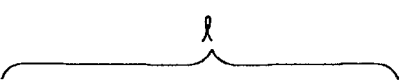

AUTO-COEFFICIENT RENEWAL DIGITAL CHANNEL EQUALIZER

BACKGROUND OF THE INVENTION

1. Field of the Invention

The present invention relates to a channel equalizer in an HDTV and, more particularly, to an auto-coefficient renewal digital channel equalizer which can renew filter coefficients automatically without separate external control.

2. Discussion of the Related Art

Most conventional digital filters are modeled after a linear system as shown in FIG. 1, which is embodied as one integrated circuit of an enormous size. For instances, up to 288 taps are used when data is 8 bits and filter coefficients are 10 bits.

FIG. 1 illustrates an FIR(Finite Impulse Response) filter, which is a typical digital filter, and FIG. 2 illustrates a detail system of the coefficient storage part shown in FIG. 1.

Referring to FIG. 1, an input data din which is received in a series of data memories 1-1~1-N of flipflops, is shifted continuously in the direction of the arrow based on transitions in the level of a system clock. Each of the data $din_1$, $din_2$, - - -, $din_n$ stored in the data memories 1—1~1-N and each of filter coefficients $C_0$, $C_1$, - - -, $C_{n-1}$ stored in coefficient memories 2-1~2-N are multiplied in respective multipliers 3-1~3-N, the multiplied results are added together in an adder 4 for n filter taps. An address signal Address designating a tap of the coefficient memories 2-1~2-N is applied from outside of the system for loading a filter coefficient Cin of the coefficient memories 2-1~2-N. That is, the digital filter multiplies the externally applied coefficients $C_0$, $C_1$, - - -, $C_{n-1}$ for the taps and the data shifted tap-by-tap which is stored in the data memories 1-1~1-N, respectively. Then the digital filter adds all the results of multiplication for the taps.

Referring to FIG. 2, for conducting an adaptive filtering, two memories 2a and 2b are provided in parallel in each of the coefficient memories 2-1~2-N, one of which being one is designated as a working bank and the other one being designed as a shadow bank by applying a bank selecting signal bs1 thereto. That is, if the coefficient $C_{k, 1}$ stored in the first memory 2a is selectively produced through a multiplexer MUX1 in response to the bank selecting signal bs1, the second memory 2b, then defined as the shadow bank, can be updated with an address and a coefficient Cin externally. In this instant, an address signal is applied to each of the first and second memories 2a and 2b (i.e., a load enable signal through an address decoder 2c). If coefficients of $C_{1, 2}$, $C_{2, 2}$, - - -, $C_{n-1, 2}$ are renewed with new coefficients for each of the n taps, the bank selecting signal is inverted with change of the working bank and shadow bank. That is, at this time, the second memory becomes the working bank to produce a coefficient $C_{k, 2}$ stored therein selectively through the multiplexer MUX1 in response to the bank selecting signal bs1, and to enable the first memory 2b, then defined as the shadow bank, to be updated with new coefficients $C_{1, 1}$, $C_{2, 1}$, - - -, $C_{n-1, 1}$, externally. Thus, the coefficient storage parts 2-1~2-N, update their filter coefficients without influencing the present filtering operation. Upon completion of the updating, the role of the coefficient banks of each coefficient memory 2-1~2-N is switched to continue the filtering operation using the renewed coefficients.

FIG. 3 illustrates a channel equalizer of LMS(Least Mean Square) algorithm having the filter shown in FIG. 1 applied thereto. In principle, the coefficients for the channel equalizer should be renewed and, at the same time, equalized data should be produced in the same intervals with the intervals of data reception. In an actual hardware design of the channel equalizer, the channel equalizer should be provided with a coefficient renewing part 5 for calculation and renewal of a coefficient, a channel equalizing filter 6 for equalizing an actually received data using the coefficient received from the coefficient renewing part 5, and a controlling part 7 for controlling the operations of the channel equalizing filter 6 and the coefficient renewing part 5. However, the coefficient renewing part 5 can not carry out the coefficient calculating and renewing operations as fast as the rate of the data reception because the channel equalizer, which should renew the coefficients for all taps based on the following equation has only one actual circuit operation as a coefficient calculating part 5c for renewal of the coefficients in the coefficient renewing part 5.

$$C_{k-1}^{j+1} = C_{k-1}^{j} + \Delta \times error \times din_{,k} \qquad (1),$$

where $C_k$ is a coefficient of a kth tap, $\Delta$ is a step size, which is a factor for use in renewing the filter coefficient, error is an external error signal, and $din_{,k}$ is a data stored in kth tap. That is, in order to satisfy equation (1), the number of the calculating parts 5c which should be provided for renewing the coefficients equals the number of taps in the channel equalizer. However, provision of such number of calculating parts 5 causes difficulty in designing the hardware. Therefore, in order to cope with this difficulty, the coefficient renewing part 5 is adapted to store a predetermined amount of the data received by the channel equalizing filter 6, and reproduce the stored data at a slower rate which is proportional to the number of taps. Then, the coefficient renewing part 5 renews the rest of coefficients using an output of the filter 5d and operates the filter 5d with the renewed coefficients. As one coefficient for one tap can be renewed in one operation, such an operation is repeated a number of times equal to of taps in the filter; the data being processed at a slow rate for satisfying the equation (1). The channel equalizer, having thus calculated the coefficients all of the taps, downloads the coefficients into the shadow banks of the channel equalizing filter 6 according to the bank selecting concept shown in FIG. 2, and, upon renewal of the coefficients throughout the taps, inverts the bank selecting signal to exchange the working bank and the shadow bank of the channel equalizing filter 6. Accordingly, the channel equalizing filter 6 is operated with the renewed coefficients.

In the meantime, according to the GA(Grand Alliance) HDTV standard, a VSB(Vestigial Sideband) transmission system is used for the HDTV transmission system, in which data is transmitted with a data format as shown in FIG. 4. Since a conventional channel equalizer is operated according to the concept shown in FIG. 3, the channel equalizer renews a channel equalizing coefficient of one tap per one symbol. Therefore, because of this operation speed limitation of the channel equalizer, of the one frame data on the 313 lines shown in FIG. 4, the data actually used in the coefficient renewal of the channel equalizer can not exceed an amount of data(260416/n) representing a division of the entire data(260416 symbols) by the number of taps of the channel equalizer(n). For example, if the number of taps of the channel equalizer n=256, the data used in the coefficient renewal of the channel equalizer among data of one frame are 1017(260416/256).

Thus, since the conventional channel equalizer operates based on filter coefficients (Cin) provided from outside the channel equalizer, the conventional channel equalizer is not suitable for application to an adaptive filtering. That is, in the adaptive filtering when an external coefficient renewing function is used, the conventional channel equalizer, should load a coefficient into the filter as soon as it is renewed. Because the conventional channel equalizer requires an additional external memory for storing the coefficient, an additional controlling block for down loading the coefficient stored in the memory into the filter, and a block for elimination of the problem coming from the non-real time coefficient renewal, the conventional channel equalizer has problems in that a circuit size of the equalizer becomes too large and a real time adaptive filtering can not be achieved.

SUMMARY OF THE INVENTION

Accordingly, the present invention is directed to an auto-coefficient renewal digital channel equalizer that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the auto-coefficient renewal digital channel equalizer including auto-coefficient renewing means for auto-renewing of a coefficient using a received data and error signal, error detecting means for detecting an error signal from a signal of the auto-coefficient renewing means, means for determining convergence or divergence of the error signal detected in the error detecting means to generate a convergence or divergence signal according to the determination, and error processing means for shifting down the error signal detected in the error detecting means for a certain bits in response to a convergence signal and producing to the auto-coefficient renewing means.

In other aspect of the present invention, there is provided an auto-coefficient renewal digital channel equalizer including a plurality of first storage parts for shifting received data from one of the first storage part to another in succession and storing the received data, a second storage part for successive delay of the received data by clocks delayed in external error signal calculations, a plurality of coefficient renewing parts each for carrying out coefficient renewal using the data from the second storage part and external error signal and address signal, a plurality of multiplying parts each for multiplying the coefficient renewed in one of the plurality of coefficient renewing parts and a corresponding data from one of the plurality of the first storage parts, and an adding part for adding outputs from the plurality of multiplying parts together.

In another aspect of the present invention, there is provided an auto-coefficient renewal digital channel equalizer including a plurality of data memories each for storing a received data in succession, an information detecting part for detecting required information from each of the received data, a plurality of information storage parts each for successive shifting of the information detected in the information detecting part to the same position as a position of the received data corresponding to the information in one of the plurality of data memories, a delay memory for delaying an output from each of the plurality of information storage parts by a clock delayed in an external error signal calculating process, a plurality of coefficient renewing parts each for using the information delayed in the delay memory, and external error signal and address signal in automatic renewal of a coefficient, a plurality of multiplying parts each for multiplying the coefficient obtained in one of the plurality of coefficient renewing parts and the data corresponding to the information from one of the plurality of data memories, and an adding part for adding the outputs from the plurality of multiplying parts, together.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings:

In the drawings:

FIG. 7 illustrates a detail system of the convergence/divergence determining part shown in FIG. 5;

FIG. 8 illustrates a detail system of the error processing part shown in FIG. 5;

FIG. 11 illustrates a detail system of the coefficient renewing part shown in FIG. 10;

FIG. 12 illustrates operation modes of the coefficient renewing part shown in FIG. 11; and, FIGS. 13a~13c illustrates error ranges according to states of the auto-coefficient renewal digital channel equalizer in accordance with a preferred embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Figure 5:
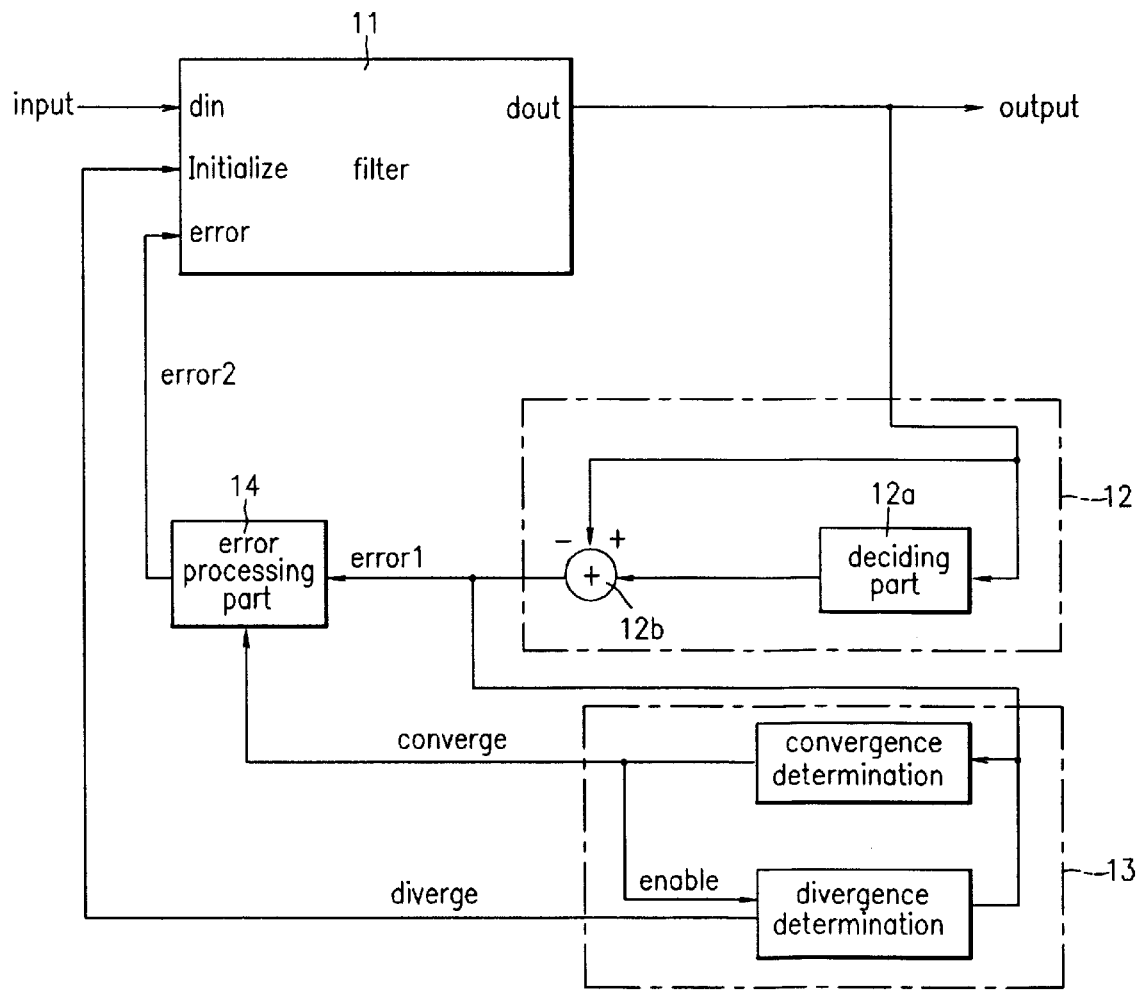
FIG. 5 illustrates a block diagram of an auto-coefficient renewal digital channel equalizer in accordance with a preferred embodiment of the present invention.

FIG. 5 illustrates a block diagram of a fast HDTV digital channel equalizer in accordance with a preferred embodiment of the present invention.

Referring to FIG. 5, the digital channel equalizer in accordance with a preferred embodiment of the present invention includes a filter 11 for renewing coefficients, an error detecting part 12 for obtaining an error signal from an output of the filter 11, a convergence/divergence determining part 13 for determining convergence/divergence of the error signal detected in the error detecting part 12 to produce a convergence or divergence signal, and error processing part 14 for producing an error signal smaller than the error signal detected in the error detecting part 12 by shifting down the error signal detected in the error detecting part 12 a predetermined number of bits in response to the convergence signal from the convergence/divergence determining part 13 and for applying the error signal to the filter 11.

Figure 6:
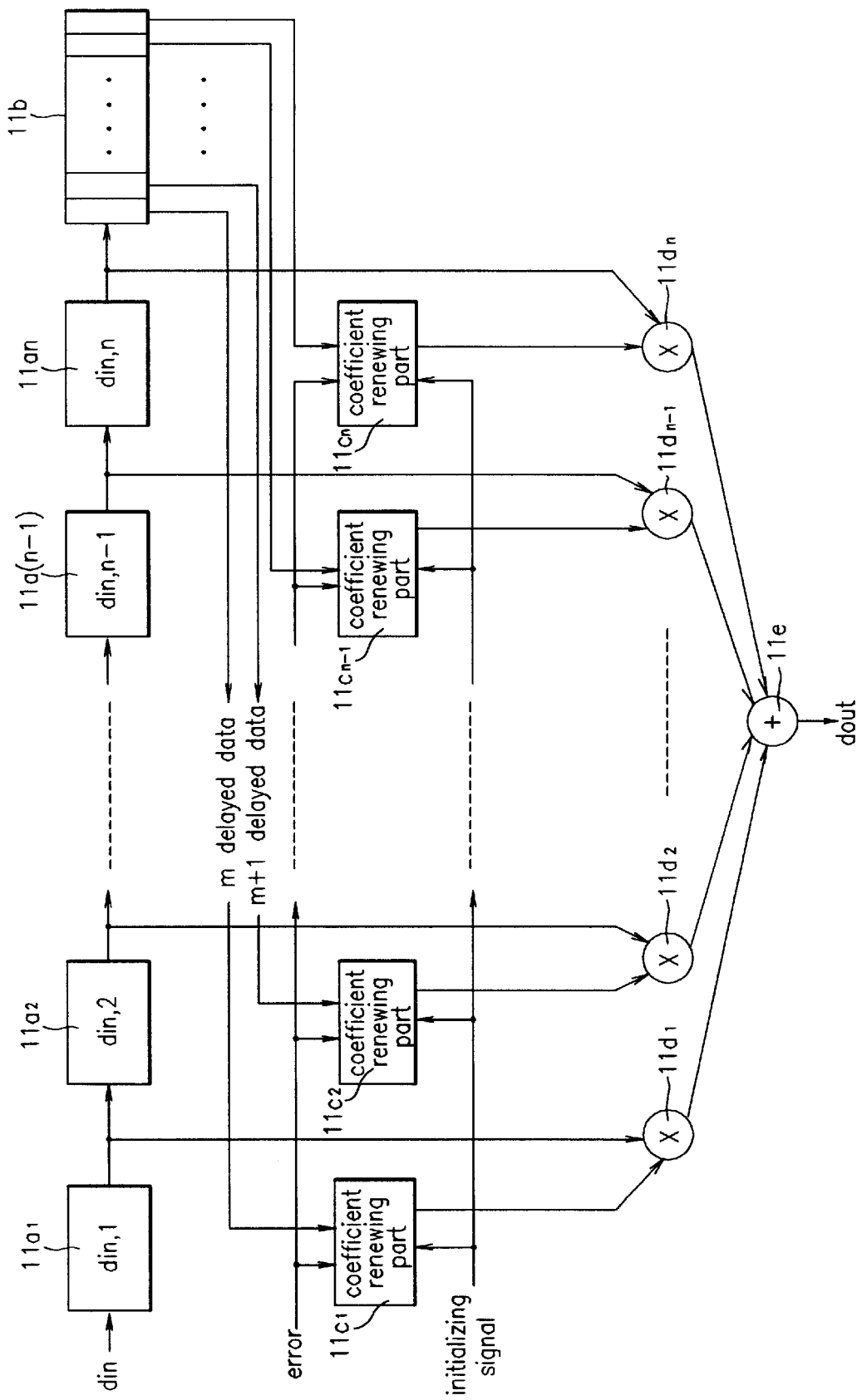
FIG. 6 illustrates a detail system of a first embodiment of the digital filter shown in FIG. 5.

Referring to FIG. 6, the filter 11 includes a data memory 11a for storing received data in succession, a delay memory 11b for delaying the received data as much as a delay clock for use in an error signal calculation, a coefficient renewing part 11c for carrying out coefficient renewal using the data from the delay memory 11b and a received error signal, a multiplier 11d for multiplying the coefficient renewed in the coefficient renewing part 11c and a corresponding data from the data memory 11a, and an adding part 11e for adding outputs of the multipliers 11d.

The error detecting part 12 includes a deciding part 12a for producing a decided data from an output of the filter 11, and an adder 12b for subtracting the decided data of the deciding part 12a from the output of the filter 11 to produce an error signal.

Referring to FIG. 7, the convergence/divergence determining part 13 includes a squaring part 13a for obtaining a square of the error signal from the error detecting part 11, an average producing part 13d having an adder 13b and a memory 13c for accumulating outputs of the squaring part 13a to produce a mean square error, a comparator 13e for comparing an output of the average producing part 13d to a preset reference value to produce a convergence signal if the output from the average producing part 13d is smaller than the preset reference value, and a comparing part 13f generating an output that is enabled by an initial convergence signal from the comparator 13e for comparing an output of the average producing part 13d to a preset reference value to produce a divergence signal as an initialized signal for the filter 11 if the output of the average producing part 13d is greater than the preset reference value.

Referring to FIG. 8, the error processing part 14 includes an one bit shifter 14a for shifting down an error signal received according to the convergence signal from the convergence/divergence determining part 13.

In the aforementioned digital channel equalizer in accordance with a preferred embodiment of the present invention, the coefficient renewing part 11c in the filter 11 calculates a new filter coefficient using an error signal from error processing part 14 and data that is delayed according to an external error signal calculating process, i.e., received data stored either in the data memory 11a or in the delay memory 11b through the data memory 11a. An output of the coefficient renewing part 11c is multiplied to corresponding data from the data memory 11a in the multiplier 11d and added together in the adder 11e to produce an equalized data finally.

In the meantime, the error detecting part 12 uses adder 12b to add an output from the filter 11 with decided data from the deciding part 12a to obtain an error signal, which error signal is applied to the convergence/divergence determining part 13 for use in determining convergence/divergence. That is, the convergence/divergence determining part 13 uses squaring part 13a to obtain a square of the error signal which is applied to the average producing part 13. According to this, the average producing part 13d accumulates outputs of the squaring part 13a in the memory 13c through the adder 13b, obtains an average of the outputs, and applies to the comparing parts 13e and 13f. Then, the comparing part 13e compares a preset reference value to the output of the average producing part 13d to produce the convergence signal if the output of the average producing part 13d is smaller than the preset reference value. Upon reception of the convergence signal, the error processing part 14 uses one bit shifter 14a to shift down the error signal received from the error detecting part 12. Because it is shifted down, the error signal is changed to an error signal of a smaller size as shown in FIG. 13c, with backward 1—1 bits in the original error signal shown in FIG. 13b neglected. FIG. 13a illustrates a range of the error signal received by the filter 11, FIG. 13b illustrates a range of the error signal to be applied to the filter 11 under a regular state, and FIG. 13c illustrates a range of the error signal to be applied to the filter 11 under a divergence state. Because a channel equalizer can be operated more exactly by realizing equation (1) (explained in the conventional art) through the incorporation of equation (2) into a hardware, this system has been applied to the conventional channel equalizer. Alternatively, under a divergence state, the data should be processed with a step size $\Delta$ made to $\Delta/2^1$ as shown in the following equation (3) in a process of coefficient renewal.

Since the channel equalizer of the present invention is operated much faster than the conventional channel equalizer, the operation of the channel equalizer is exact even if coefficients of the channel equalizer are renewed according to the following equation (4) with errors one-bit shifted down to error/$2^1$ in the error processing part 14 disposed outside of the filter 11. Thus, an effect of $\Delta/2^1$ can be achieved and the channel equalizer can be converged without increasing both the calculation amount within the filter 11 and the circuit size.

$$C_{k-1}^{j+1}=C_{k-1}^{j}+\Delta x(error \times din,_k) \qquad (2),$$

$$C_{k-1}^{j+1}=C_{k-1}^{j}+\Delta/2^1 \, x(error \times din,_k) \qquad (3),$$

$$C_{k-1}^{j+1}=C_{k-1}^{j}+\Delta x(error/2^1 \times din,_k) \qquad (4).$$

The performance degradations from the methods of embodying the equations (3) and (4) can be compensated with very fast operation of the channel equalizer of the present invention when compared with the conventional channel equalizer.

Figure 1:
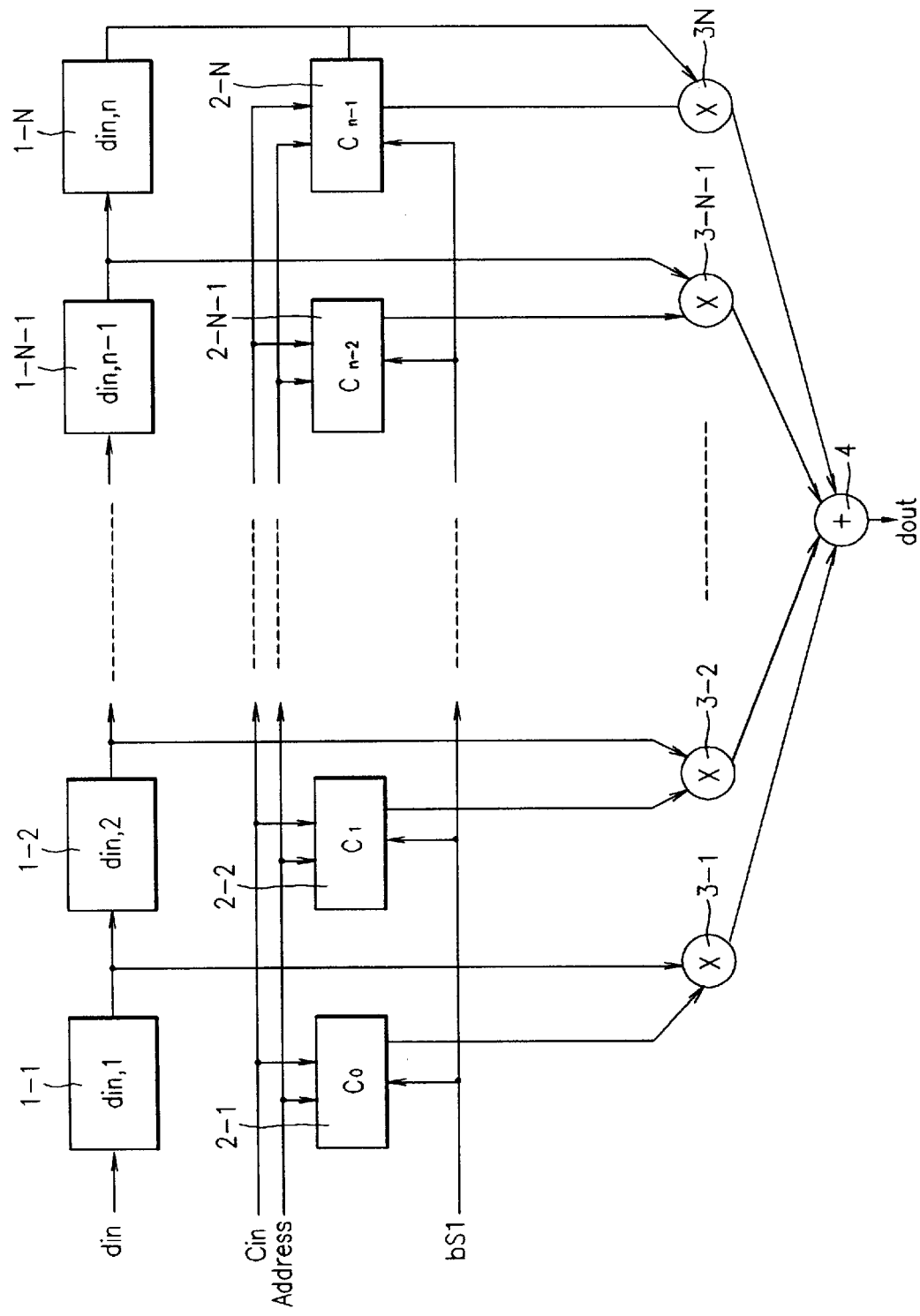
FIG. 1 illustrates a block diagram of a conventional digital filter.
Figure 2:
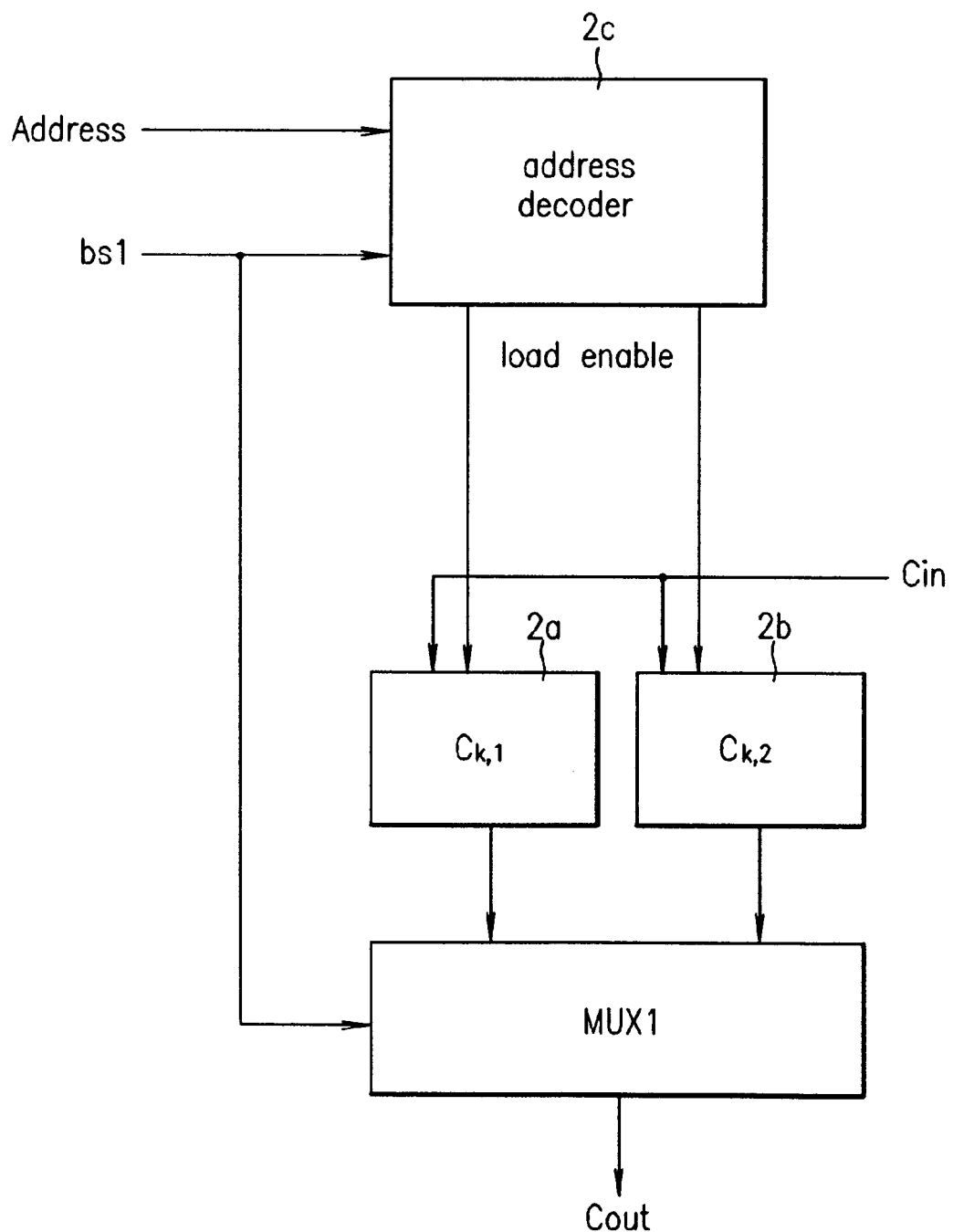
FIG. 2 illustrates a detail block diagram of the coefficient storage part shown in FIG. 1.
Figure 3:
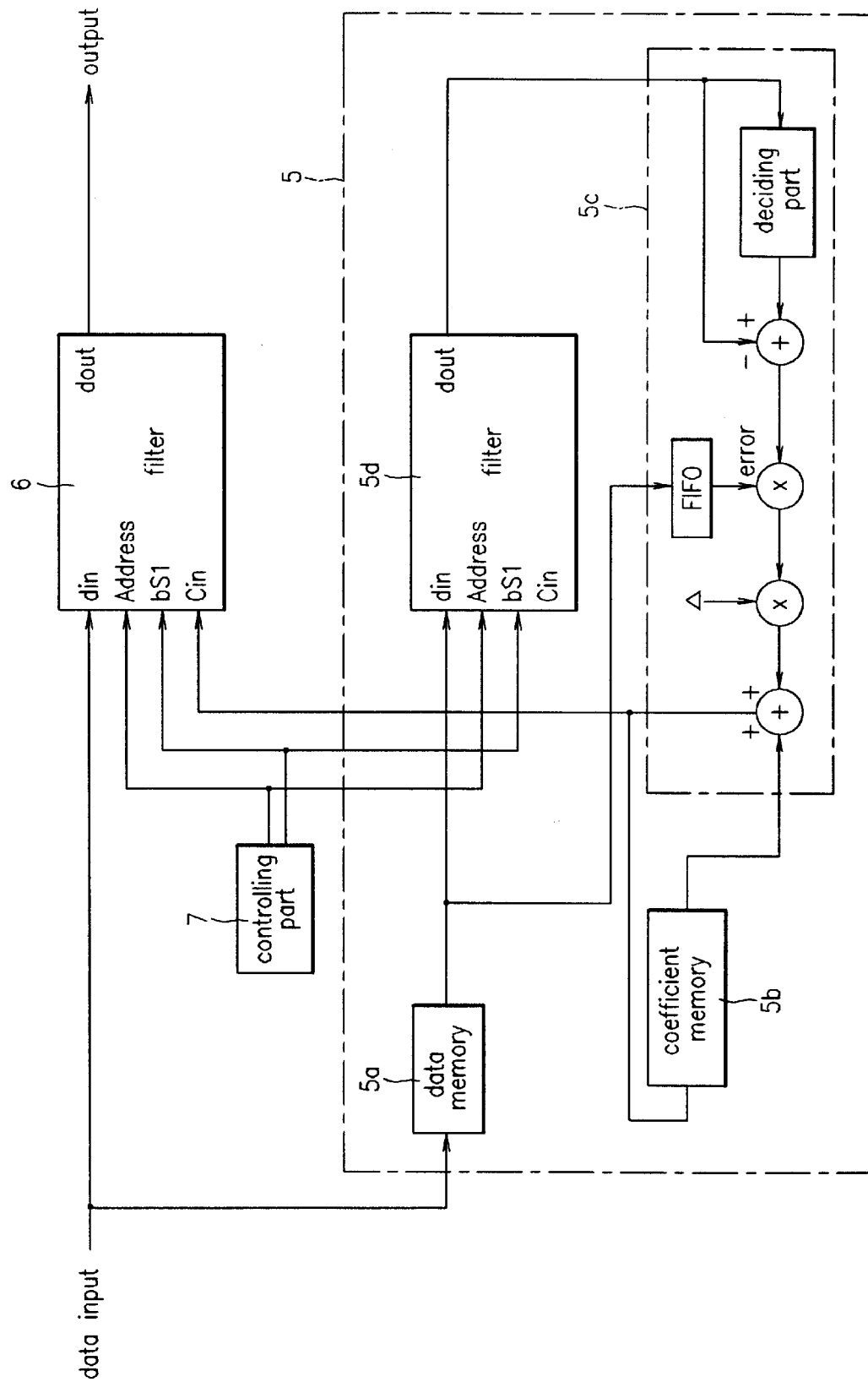
FIG. 3 illustrates a block diagram of a conventional channel equalizer having the digital filter shown in FIG. 1 applied thereto.
Figure 4:
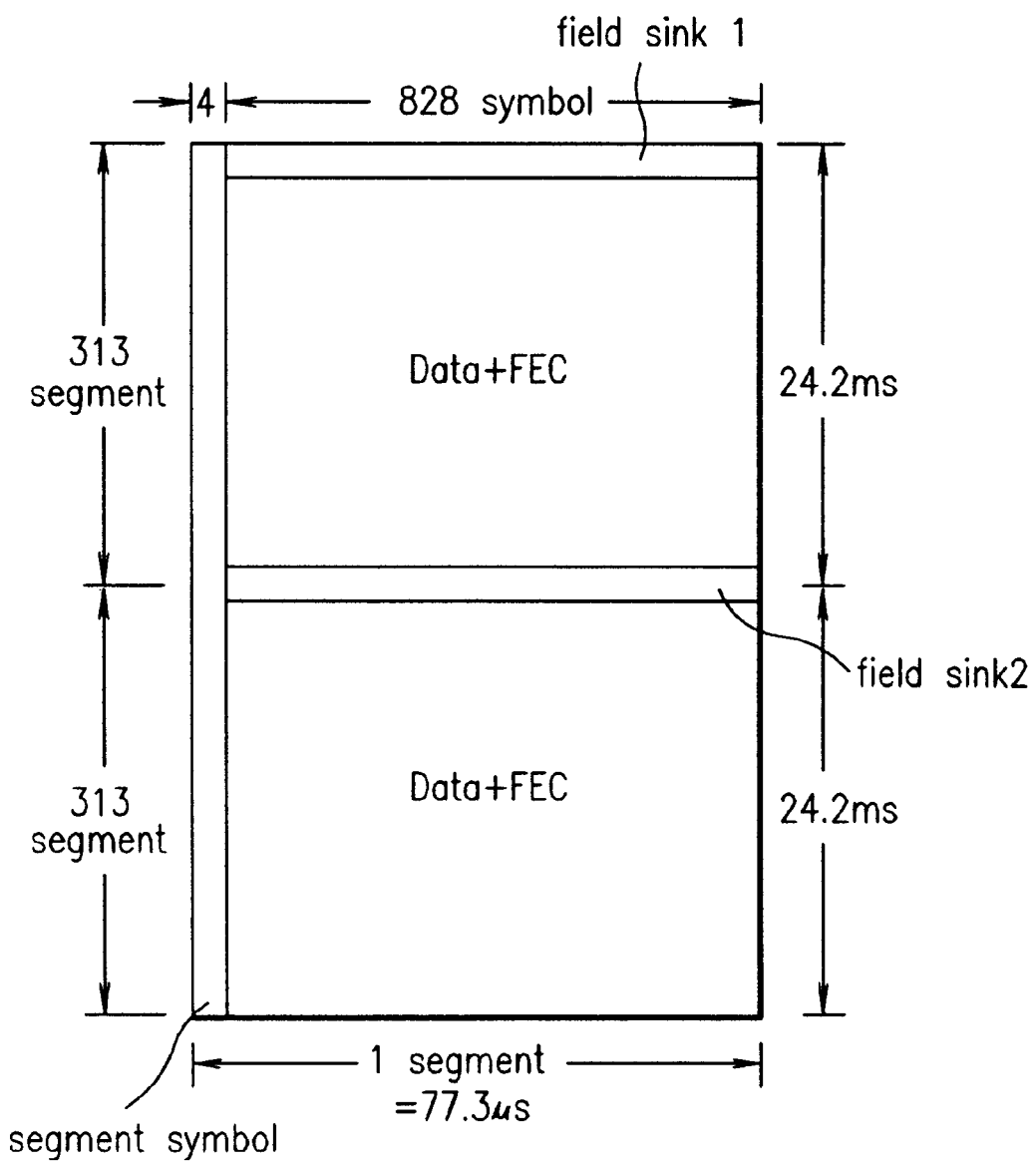
FIG. 4 illustrates a conventional HDTV signal transmission format.

In the meantime, the comparing part 13f compares the preset reference value and the output of the average producing part 13d to produce a divergence signal when the output of the average producing part 13d is greater than the preset reference value. The comparing part 13f is enabled by the initial convergence signal from the comparing part 13e. Thus, the comparing part can produce a divergence signal only after the comparing part 13e produces at least one convergence signal. That is, even though operation of the channel equalizer will be reverted from equation (4) to equation (3) when the channel equalizer comes out of a convergence state momentarily due to unknown reasons in an HDTV reception channel, (for example, in case an airplane passes nearby), the operation of the channel equalizer is diverted from equation (3) to equation (4), when after channel equalizer begins converging to achieve convergence at a fast speed. Thus the convergence/divergence determining part 13 produces the divergence signal as a counter measure for an occurrence of an unexpected situation. If the channel equalizer is detected in a divergence state, this signal is applied to the filter 11 as an initialize signal to initialize a center tap coefficient to 1.0 and coefficients of the rest of the taps to 0.0 by operation of the coefficient renewing part 11c in the filter 11, and to initiate the equalizing operation again. And, the convergence/divergence determining part 13 is operable in a field sink section in an HDTV transmission frame shown in FIG. 4 because an exact average of this section can be calculated since the data to be received at this section from the receiver is predetermined and since the section is a training section.

Figure 9:
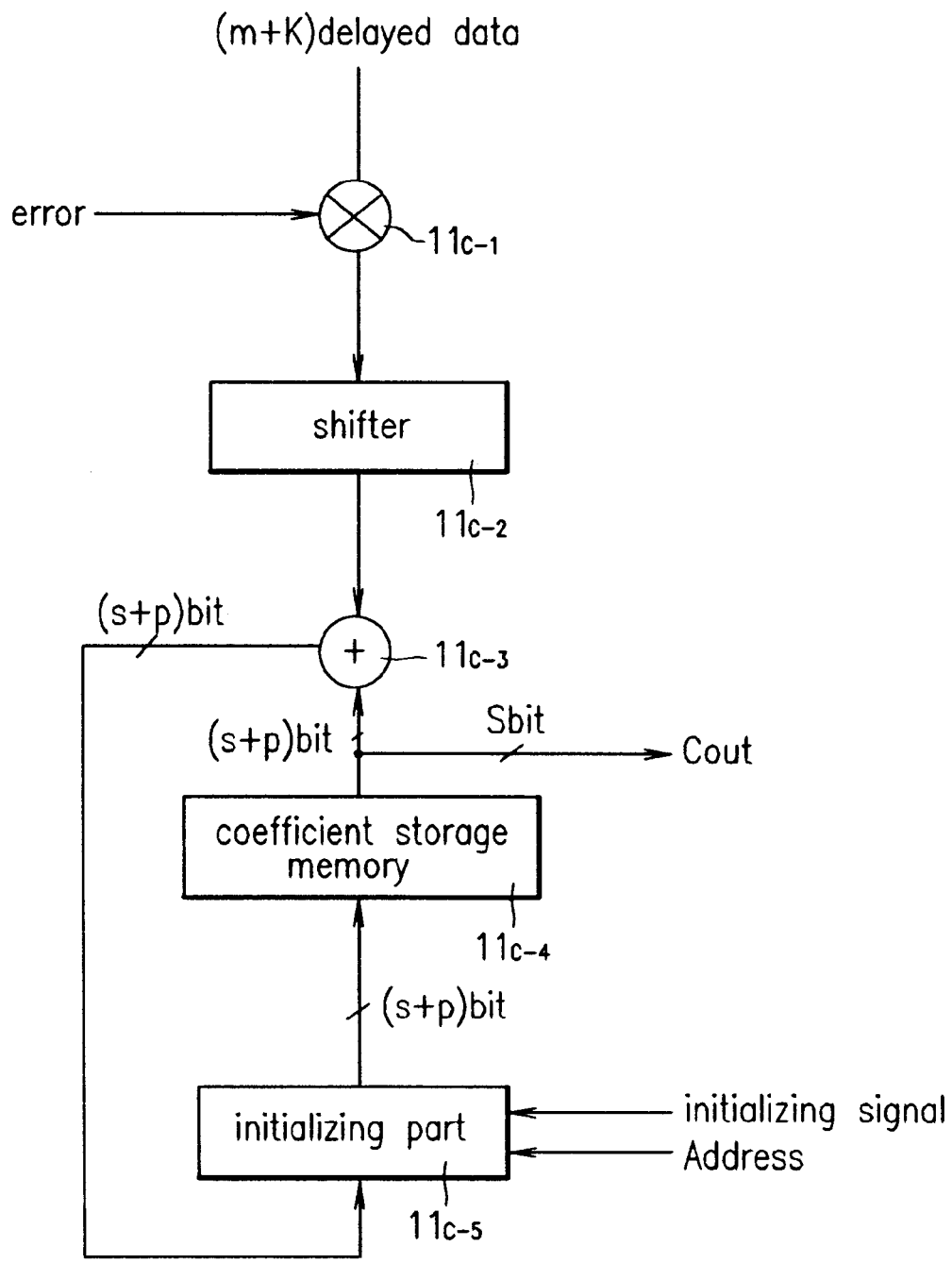
FIG. 9 illustrates a detail system of a kth tap in the coefficient renewing part shown in FIG. 6.

Referring to FIG. 9, each of the coefficient renewing parts 11c1~11cn shown in FIG. 6 includes a multiplier 11c-1 for multiplying a data delayed by m+k and an error signal, a shifter 11c-2 for shifting an output of the multiplier 11c-1 by a predetermined step size Δ, an initializing part 11c-5 for, initialzing a coefficient to be 1.0 when received initializing signal is active if the initializing signal is selected by an address signal and to be 0.0 when a received initializing signal is active if the initializing signal is not selected by the address signal, a coefficient storage memory 11c-4 for storing the present coefficient of a tap and for storing a new coefficient of the tap to be calculated from the present tap, and an adder 11c-3 for adding an output from the shifter 11c-2 and the present coefficient of the tap stored in the coefficient storage memory 11c-4 to produce a new coefficient of the tap, which is transmitted outwardly as well as stored in the coefficient storage memory 11c-4 through the initializing part 11c-5.

Referring to FIG. 6, received data din is received at the data memories 11a1–11an, shifted in the direction of the arrow in response to each transition of a system clock, and ultimately stored in the delay memory 11b. The received data is stored in the delay memory 11b, for delaying corresponding received data by a time delay occurred in an error signal calculating process to be employed in a coefficient renewal in the coefficient renewing parts 11c1–11cn, which will be explained later for use in the error signal calculating process. Each of the coefficient renewing parts 11c1–11cn uses an error signal received from outside of the filter and data stored in a tap after mth tap counted from the present tap, i.e., a data output after mth from the data memory 11a or the delay memory 11b in calculating a new filter coefficient. As an LMS(Least Mean Square) algorithm is excellent in the field of an adaptive filtering, when a size of hardware to be embodied and the performance compared to the size required are taken into consideration, this algorithm is employed, in which the aforementioned equation (1) is used for renewing a filter coefficient. Though there are differences from one adaptive filtering algorithm to another adaptive filtering algorithm, an error is in general obtained as a difference of an filter output from a reference signal.

By the way, when the equation (1) is embodied into a hardware, since an amount of calculation required for calculating filter outputs, calculating errors from this calculating result, and the like is enormous, a time delay at least more than one clock is required. Therefore, in the present invention, the equation (1) can be modified as the following equation (5) when embodied in hardware, where m is a time delay taken for calculating the equation (1).

$$C_k^{j+1} = C_k^j + \Delta \cdot error \cdot din_{k+m} \qquad (5).$$

The equation (5) can be calculated by operating the coefficient renewing part 11c1–11cn using symbols m delayed through the delay memory 6. The delay of m, in its detailed meaning, is a converted number of time delays both in the process for multiplying the data from the data memories 11a1–11an and the filter coefficients in the multipliers 11d1–11dn, and adding the results for all of the n taps in the adder 11e, which time delays are measured until application of an error to the filter of the present invention after obtaining the error using an output data dout of the filter with the algorithm for calculating an error of an adaptive filtering in outside of the filter. The address signal applied to the coefficient renewing parts 11c1–11cn, which determines a position of the center tap of all the taps, and, when an initializing signal is active, the tap designated by the address signal is initialized to have a filter tap coefficient of 1.0 by a corresponding initializing part 11c-5, and rest of the taps not designated by the address signal are initialized each to have a filter tap coefficient of 0.0 by respective initialzing parts 11c-5. The multiplier 11c-1 multiplies an m+k delayed data from the delay memory 11b and an error signal applied externally, which is then shifted in the shifter 11c-2 by a predetermined step size Δ to scale down a resultant of the multiplication. The resultant of the multiplication is renewed into a new coefficient of the tap by being added with the present coefficient of the tap stored in the coefficient storage memory 11c-4 in the adder 11c-3, and transmitted to outwardly and stored in the coefficient storage memory 11c-4 for the next tap coefficient calculation. In this case, even if an s number of bits are required for the digital filter, each of the coefficient renewing parts 11c1–11cn uses the s number of bits together with a p number of bits expanded to an LMS side in the coefficient storage memory 11c-4 for stability and exactness sake in the coefficient renewal. That is, the total number of bits used in the coefficient renewal is s+p bits.

Figure 10:
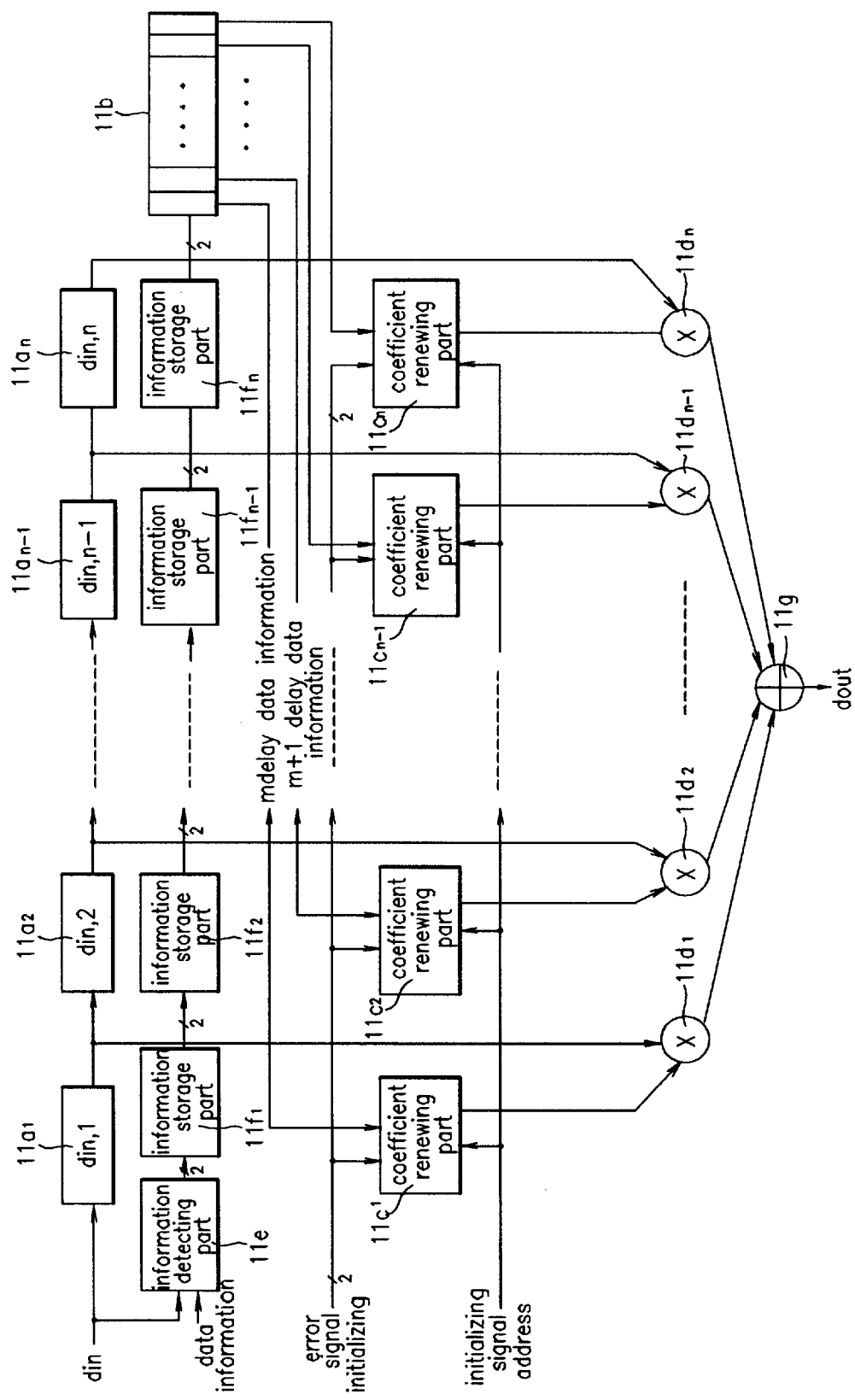
FIG. 10 illustrates a detail system of a second embodiment of the digital filter shown in FIG. 5.

FIG. 10 illustrates a detail system of a second embodiment of the digital filter shown in FIG. 5, an embodiment of a coefficient renewing circuit simplified in comparison to the first embodiment wherein the filter coefficient renewing equation is further simplified utilizing size and negative/positive polarity information of an error signal and size and negative/positive polarity information of a data.

Referring to FIG. 10, the second embodiment filter 11 includes data memories 11a1–11an for storing received data in succession, an information detecting part 11e for receiving information on a received data regarding its negative or positive polarity and its size relative to a predetermined size, information storage parts 11f1–11fn for successfully shifting outputs of the information detecting part 11e to the same positions with corresponding data in the data memories 11a1–11an, a delay memory 11b for delaying the outputs of the information storage parts 11f1–11fn as much as delay clocks for external error signal calculation processes, coefficient renewing parts 11a1–11an each for carrying out coefficient renewal using the delayed information of data either from the information storage part 11f or from the delay memory 11b, the error signal information on the received error of being negative or positive and the size of the received error of being greater or smaller than a predetermined size, and an address signal, multipliers 11d1–11dn for multiplying coefficients obtained in the coefficient renewing parts 11c1–11cn and data from the data memories 11c1–11cn respectively, and an adding part 11g for adding outputs of the multipliers 11d1–11dn.

Referring to FIG. 11, each of the coefficient renewing parts 11c1–11cn includes a multiplexer MUX2 for selecting +1, 0, or −1 according to the error signal information and the data information delayed by the delay memory 11b, an initialzing part 40 for initializing a coefficient to be 1.0 in case the initializing signal is selected by an address signal and to be 0.0 in case the initializing signal is not selected by the address signal, when a received initializing signal is active, a coefficient storage memory 30 in storage of the present coefficient of the tap and to store a new coefficient of the tap to be calculated from the present tap, and an adder 20 for adding an output from the multiplexer MUX2 and the present coefficient of the tap stored in the coefficient storage memory 30 to make a new coefficient of the tip, which is transmitted to outwardly as well as stored in the coefficient storage memory 30 through the initializing part 40.

Because the amount of calculation required for calculating the terms of Δ·error·din, $_{k+m}$ is enormous when the aforementioned second embodiment digital filter is implemented by hardware using the equation (2) of the first embodiment, the equation is simplified as the following equation (6) for use in carrying out an adaptive filtering.

$$C_k^{j+1}=C_k^j \qquad (6\text{-}1),$$

$$C_k^{j+1}=C_k^j+1 \qquad (6\text{-}2),$$

$$C_k^{j+1}=C_k^j-1 \qquad (6\text{-}3).$$

The equation (6-1) represents either a case when an external adaptive filtering error is smaller than a predetermined size, or a case when the term din, $_{k+m}$ is smaller than a predetermined size, wherein a resultant of a calculation for the terms of Δ·error·din, $_{k+m}$ is approximated to naught. The equation (6-2) represents a case when all of the error and the term din, $_{k+m}$ are greater than the predetermined size while their polarities are identical, wherein the resultant of a calculation for the terms of Δ·error·din, $_{k+m}$ is approximated to unity. And, the equation (6-3) represents a case when all of the error and the term din, $_{k+m}$ are greater than the predetermined size while their polarities are opposite, wherein the resultant of a calculation for the terms of Δ·error·din, $_{k+m}$ is approximated to −1. That is, the above equations (6-1, 2 and 3) may be represented as shown in table 12 in FIG. 12 according to the received error signal information and the data information. In order to make the filter operable as the foregoing, two bits of error signal information on the error of being greater or smaller than the predetermined size and of being a positive or negative polarity should be applied to the coefficient renewing parts 11c1–11cn from outside of the filter, and two bits of data information on the data of being greater or smaller than the predetermined size and of being a positive or negative polarity should be applied to the information detecting part 11e from outside of the filter. Outputs of the information detecting part 11e are shifted to the same positions of respective data in the data memories 11a1–11an through the information storage parts 11a1–11an in succession, and thereby stored in the delay memory 11b. The delay memory 11b is used, for delaying corresponding data information by the clock for calculating an error signal for application of the error signal information to the coefficient renewing parts 11c1–11cn.

The error signal information and the data information is applied to the coefficient renewing parts 11a1–11an and used in calculation of coefficients for renewing the coefficients, the operation of which coefficient renewing parts 11a1–11an for renewing coefficients will be explained, hereinafter.

The initializing part 40 receives an address signal and an initializing signal; the address signal determines a position of a center tap of all the taps, and, when the initializing signal is active, the tap designated by the address signal is initialized to have a coefficient of 1.0, and if not designated, initialized to have a coefficient of 0.0. And, the multiplexer MUX2 selects and produces +1, 0, or −1 so that the coefficient renewing parts 11c1–11cn is operated as shown in the table in FIG. 12 according to the error information and the delayed data information. Subsequently, the adder 20 adds an output of the multiplexer MUX2 and the present coefficient of the tap from the coefficient storage memory 30 into a new coefficient of the tap, which is transmitted outwardly as well as stored in the coefficient storage memory 30 through the initializing part 40 for the next tap coefficient calculation. In this case, even if each of the coefficient renewing parts 11c1–11cn requires an s number of bits for a filter coefficient for a digital filtering, each of the coefficient renewing parts 11c1–11cn uses the s number of bits together with a p number of bits expanded to an LMS side in the coefficient storage memory 30 for stability and filtering exactness sake in the coefficient renewal. The coefficient obtained thus is multiplied with a corresponding data from the data memories 11a1–11an in the multiplier 11d1–11dn, and added together in the adder 11g and produced as a final filter output.

As has been discussed, by providing an auto-coefficient renewal function built-in the filter, the auto-coefficient renewal digital channel equalizer of the present invention facilitates a real time filter tap coefficient renewal at a rate of data input which is the theoretical maximum rate, overcoming the limitation in operation speed of an adaptive filtering, whereby a real time adaptive filtering is made possible.

And, the provision of the filter coefficient renewing part built-in the filter allows to dispense with the memory disposed outside of the filter for storing coefficients or the complicated controlling block for down loading the renewed coefficients into the filter as in the conventional art.

It will be apparent to those skilled in the art that various modifications and variations can be made in the auto-coefficient renewal digital channel equalizer of the present invention without departing from the spirit or scope of the invention. Thus, it is intended that the present invention cover the modifications and variations of this invention provided they come within the scope of the appended claims and their equivalents.

What is claimed is:

1. An auto-coefficient renewal digital channel equalizer, comprising:

auto-coefficient renewing means for automatically renewing a coefficient using received data and a second error signal;

error detecting means for detecting an error based on an output from the auto-coefficient renewing means and generating a first error signal based on the error detected; and error processing means for shifting down the first error signal detected in the error detecting means a predetermined number of bits when the error is determined to be converging to produce the second error signal that is smaller than the first error signal, and for supplying the second error signal to the auto-coefficient renewing means.

2. An auto-coefficient renewal digital channel equalizer as claimed in claim 1, further comprising means for determining convergence or divergence of the first error signal generated by the error detecting means.

3. An auto-coefficient renewal digital channel equalizer as claimed in claim 2, wherein the convergence/divergence determining means includes:

a squaring part for obtaining a square of the error signal from the error detecting means;

an average producing part for accumulating outputs of the squaring part to produce a mean square error;

a first comparing part for comparing an output of the average producing part to a preset reference value and for producing a convergence signal according to a result of the comparison; and a second comparing part enabled by a first of the convergence signals provided by the first comparing part for comparing an output of the average producing part to a preset reference value and for producing a divergence signal as an initializing signal for the coefficient renewing means based on a result of the comparison.

4. An auto-coefficient renewal digital channel equalizer as claimed in claim 3, wherein the first comparator produces the convergence signal when the output from the average producing part is smaller than the preset reference signal.

5. An auto-coefficient renewal digital channel equalizer as claimed in claim 3, wherein the second comparator produces the divergence signal when the output from the average producing part is greater than the preset reference signal.

6. An auto-coefficient renewal digital channel equalizer as claimed in claim 1, wherein the error processing means includes a shifter for shifting down the error signal received in response to the convergence signal from the means for producing a convergence or divergence signal for predetermined bits.

7. An auto-coefficient renewal digital channel equalizer comprising:
a plurality of first storage parts for storing received data, the received data being successively shifted from one of the first storage parts to another;
a second storage part for successively delaying the received data based on clocks delayed in external error signal calculations, and for storing the delayed received data;
a plurality of coefficient renewing parts, each for carrying out coefficient renewal using the data from the second storage part and an external error signal;
a plurality of multiplying parts, each for multiplying a coefficient renewed in one of the plurality of coefficient renewing parts based on the data from the second storage part with corresponding data from one of the plurality of the first storage parts; and
an adding part for adding outputs form the plurality of multiplying parts together.

8. An auto-coefficient renewal digital channel equalizer as claimed in claim 7, wherein each of the plurality of coefficient renewing parts includes:
a multiplier for multiplying an output from the second storage part and the error signal;
a shifter for shifting an output of the multiplier by a predetermined step size;
an initializing part for initializing a coefficient of a tap in response to the address signal when a received initializing signal is active;
a coefficient storage memory for storing the present coefficient of the tap and a new coefficient of the tap to be calculated from the present tap; and
an adder for adding an output from the shifter and the present coefficient of the tap, which is then transmitted outwardly as well as stored in the coefficient storage memory through the initializing part.

9. An auto-coefficient renewal digital channel equalizer as claimed in claim 8, wherein the initializing part makes a coefficient of a tap designated only by the address signal to be 1.0, and makes the rest of coefficients not designated by the address signal to be 0.0.

10. An auto-coefficient renewal digital channel equalizer as claimed in claim 7, wherein, even if each of the coefficient renewing parts requires a number of bits for a filter coefficient for a digital filtering, each of the coefficient renewing parts may use the number of bits together with a number of bits expanded to a least mean square side in the coefficient storage memory.

11. An auto-coefficient renewal digital channel equalizer, comprising:
a plurality of data memories, each storing a received data in succession;
an information detecting part for detecting required information from each of the received data;
a plurality of information storage parts, each successively shifting the information detected in the information detecting part to the same position as a position of the received data corresponding to the information in one of the plurality of data memories;
a delay memory for delaying an output from each of the plurality of information storage parts by a clock delayed in an external error signal calculating process;
a plurality of coefficient renewing parts, each for using the information delayed in the delay memory, an external error signal and an address signal in automatic renewal of a coefficient;
a plurality of multiplying parts, each for multiplying the coefficient obtained in one of the plurality of coefficient renewing parts and the data corresponding to the information from one of the plurality of data memories; and
an adding part for adding the outputs from the plurality of multiplying parts.

12. An auto-coefficient renewal digital channel equalizer as claimed in claim 11, wherein the information is used for determining whether the received data has a positive or negative polarity and for determining whether the received data is greater or smaller than a predetermined size.

13. An auto-coefficient renewal digital channel equalizer as claimed in claim 11, wherein the error information is used for determining whether the external error signal has a positive or negative polarity and for determining whether the external error signal is greater or smaller than a predetermined size.

14. An auto-coefficient renewal digital channel equalizer as claimed in claim 11, wherein, even if each of the coefficient renewing parts requires a number of bits for a filter coefficient with a number of bits expanded to a least mean square side in the coefficient storage memory.

15. An auto-coefficient renewal digital channel equalizer as claimed in claim 11, wherein each of the coefficient renewing parts includes:
a multiplexer for selecting an arbitrary value according to the error signal information and the data information delayed by the delay memory;
an initializing part for initializing a coefficient of a tap in response to the address signal when a received initializing signal is active;
a coefficient storage memory for storing the present coefficient of the tap and a new coefficient of the tap to be calculated from the present tap; and
an adder for adding an output from the multiplexer and the present coefficient of the tap stored in the coefficient storage memory to produce a new coefficient of the tap, which is output and which is stored in the coefficient storage memory through the initializing part.

16. An auto-coefficient renewal digital channel equalizer as claimed in claim 15, wherein the arbitrary value is +1, 0, or −1.

17. An auto-coefficient renewal digital channel equalizer as claimed in claim 15, wherein the initializing part makes a coefficient of a tap designated only by the address signal to be 1.0, and makes the rest of coefficients not designated by the address signal to be 0.0.

18. A method for automatically renewing coefficients of a digital channel equalizer, comprising:

storing data in a plurality of first storage parts, the data being received in fixed data units, each data unit being successively shifted from one of the first storage parts to another;

calculating error based on previously calculated coefficients and the data stored in the first storage parts;

storing the data in a second storage part while the error is calculated;

renewing the coefficients using the data stored in the second storage part and the calculated error;

multiplying the renewed coefficients with the data stored in the first storage parts corresponding thereto, and adding multiplied values.

19. A method as recited by claim 18, wherein renewing the coefficients includes:

multiplying an output from the second storage part with the calculated error;

shifting a multiplied signal by a specified step size;

initializing a coefficient of a tap in response to an address signal when a received initializing signal is active;

storing the present coefficient of the tap and a new coefficient of the tap to be calculated from the present tap; and summing and storing the shifted signal and the stored new coefficient of the tap.

20. A method for automatically renewing coefficients of a digital channel equalizer, comprising:

storing data in a plurality of first storage parts, the data being received in fixed data units, each data unit being successively shifted from one of the first storage parts to another;

extracting a characteristic of the data received in fixed data units and storing the characteristic in a second storage part;

calculating error based on previously calculated coefficients and the data stored in the first storage parts;

storing the data in a third storage part while the error is calculated;

renewing the coefficients using the data stored in the third storage part and the calculated error;

multiplying the renewed coefficients with the data stored in the first storage parts corresponding thereto, and adding multiplied values.

21. A method as recited by claim 20, wherein the characteristic of the data is information concerning whether the received data is positive or negative.

22. A method as recited by claim 20, wherein the characteristic of the data is information concerning a comparison of a size of the data relative to a reference size.

23. A method for automatically renewing coefficients of a digital channel equalizer, comprising:

storing data in a plurality of first storage parts, the data being received in fixed data units, each data unit being successively shifted from one of the first storage parts to another;

calculating error based on previously calculated coefficients and the data stored in the first storage parts;

extracting a characteristic of the data received in fixed data units and storing the extracted character information in a second storage part so as to correspond to a time period in which the error is calculated;

renewing the coefficients using the data stored in the second storage part and the calculated error;

multiplying the renewed coefficients with the data stored in the first storage parts corresponding thereto, and adding multiplied values.

* * * * *